United States Patent
Liu et al.

(10) Patent No.: US 10,859,915 B2
(45) Date of Patent: Dec. 8, 2020

(54) ADHESION LAYER FOR MULTI-LAYER PHOTORESIST

(71) Applicant: Taiwan Semiconductor Manufacturing Co., Ltd., Hsinchu (TW)

(72) Inventors: Chen-Yu Liu, Kaohsiung (TW); Tzu-Yang Lin, Tainan (TW); Ya-Ching Chang, Hsinchu (TW); Ching-Yu Chang, Yilang County (TW); Chin-Hsiang Lin, Hsin-Chu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 147 days.

(21) Appl. No.: 16/137,742

(22) Filed: Sep. 21, 2018

(65) Prior Publication Data

US 2020/0098558 A1    Mar. 26, 2020

(51) Int. Cl.

| | |
|---|---|
| *G03F 7/11* | (2006.01) |
| *G03F 7/20* | (2006.01) |
| *G03F 7/075* | (2006.01) |
| *H01L 21/027* | (2006.01) |
| *H01L 29/66* | (2006.01) |
| *H01L 29/10* | (2006.01) |
| *H01L 21/02* | (2006.01) |
| *G03F 7/16* | (2006.01) |
| *H01L 29/78* | (2006.01) |

(52) U.S. Cl.
CPC .............. *G03F 7/11* (2013.01); *G03F 7/0751* (2013.01); *G03F 7/162* (2013.01); *G03F 7/20* (2013.01); *H01L 21/0276* (2013.01); *H01L 21/02118* (2013.01); *H01L 21/02282* (2013.01); *H01L 29/1054* (2013.01); *H01L 29/66795* (2013.01); *H01L 29/785* (2013.01)

(58) Field of Classification Search
CPC .................................. G03F 7/0751; G03F 7/09
See application file for complete search history.

(56) References Cited

U.S. PATENT DOCUMENTS

| | | |
|---|---|---|
| 8,796,666 B1 | 8/2014 | Huang et al. |
| 9,012,132 B2 | 4/2015 | Chang |
| 9,028,915 B2 | 5/2015 | Chang et al. |
| 9,093,530 B2 | 7/2015 | Huang et al. |
| 9,146,469 B2 | 9/2015 | Liu et al. |
| 9,213,234 B2 | 12/2015 | Chang |
| 9,223,220 B2 | 12/2015 | Chang |
| 9,256,133 B2 | 2/2016 | Chang |
| 9,536,759 B2 | 1/2017 | Yang et al. |
| 9,548,303 B2 | 1/2017 | Lee et al. |
| 2010/0248428 A1* | 9/2010 | Yoshida .................. H01L 24/03 438/118 |

* cited by examiner

*Primary Examiner* — Kathleen Duda
(74) *Attorney, Agent, or Firm* — Haynes and Boone, LLP

(57) ABSTRACT

A method is provided including forming a first layer over a substrate and forming an adhesion layer over the first layer. The adhesion layer has a composition including an epoxy group. A photoresist layer is formed directly on the adhesion layer. A portion of the photoresist layer is exposed to a radiation source. The composition of the adhesion layer and the exposed portion of the photoresist layer cross-link using the epoxy group. Thee photoresist layer is then developed (e.g., by a negative tone developer) to form a photoresist pattern feature, which may overlie the formed cross-linked region.

20 Claims, 8 Drawing Sheets

ADHESION LAYER FOR MULTI-LAYER PHOTORESIST

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

In one exemplary aspect, photolithography (or simply "lithography") is a process used in micro-fabrication, such as semiconductor fabrication, to selectively remove parts of a thin film or a substrate. The process uses radiation (e.g., light) to transfer a pattern (e.g., a geometric pattern) from a photomask to a light-sensitive layer (e.g., a photoresist layer) on the substrate. Recently, advances such use of an extreme ultraviolet (EUV) radiation source have been utilized to provide reduced feature sizes due to its short exposure wavelengths (e.g., less than 100 nm). Additional efforts have been made with the reduced feature sizes to improve photoresist, in some cases providing for thinner or multi-layer resists. These advances in lithography and materials have in some embodiments been generally beneficial, they have not been entirely satisfactory. For example, with reference to the photoresist poor critical dimension uniformity, line edge roughness, photoresist feature collapsing and/or increased defect counts have been encountered. For these reasons and others, additional improvements are desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
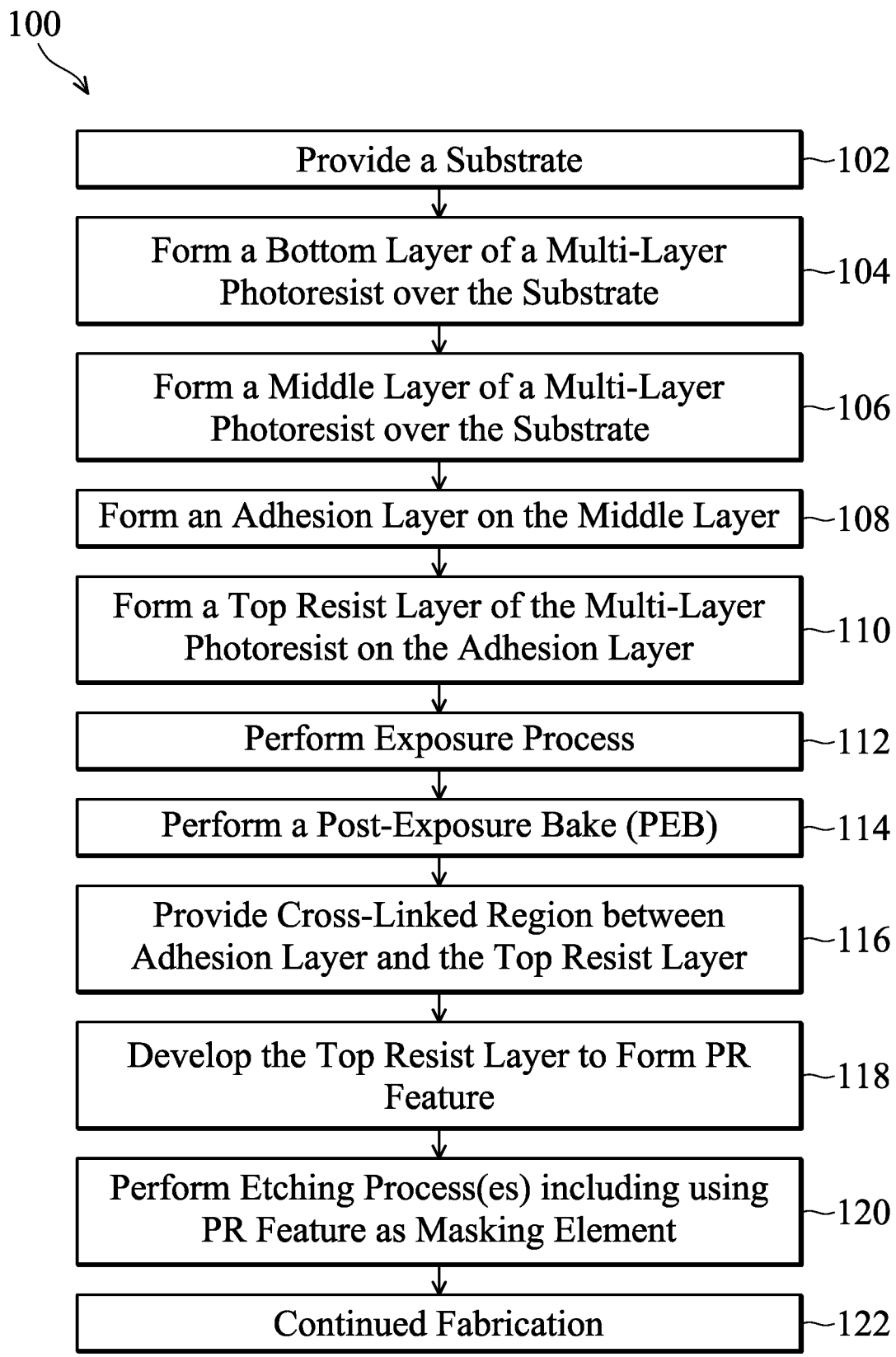
FIG. 1 illustrates a flowchart of an exemplary method according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact or directly interfacing, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure relates generally to IC device manufacturing and, more particularly, to device patterning processes using a multi-layer photoresist stack. However, one of ordinary skill in the art may recognize other implementations of certain embodiments of the adhesion layer provided herein which would also be within the scope of the present disclosure.

Photoresist feature collapse plays a role in semiconductor fabrication including when the dimension of a semiconductor feature decreases to the range of 28 nanometers or less. Such collapse or peeling off of a feature impacts the reproduction of the pattern. Accordingly, the present disclosure provides a multi-layer photoresist stack and corresponding fabrication methods that in some embodiments reduce for feature collapse during lithography patterning processes by providing beneficial adhesion between layers of the multi-layer photoresist.

FIG. 1 illustrates a flowchart of a method 100 for patterning a device according to some aspects of the present disclosure. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the process. Intermediate steps of the method 100 are described with reference to cross-sectional views of the device 200 as shown in FIGS. 2-12 as well as FIGS. 13-15 providing additional illustrations as to chemical structures formed at an interface provided in some embodiments of the method 100.

Referring to block 102 of FIG. 1, the method 100 provides (or is provided with) a device including a substrate for patterning. Referring to the example of FIG. 2, the device 200 includes a substrate 202. The substrate 202 may comprise an elementary (single element) semiconductor, such as germanium and/or silicon in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof. The substrate 202 may be a single-layer material having a uniform composition; alternatively, the substrate 202 may include multiple material layers having similar or different compositions suitable for IC device manufacturing. In one example, the substrate 202 may be a silicon-on-insulator (SOI) substrate having a semiconductor silicon layer formed on a silicon oxide layer. In other example, the substrate 202 may include conductive layers, semiconductor layers, dielectric layers, other layers, and/or combinations thereof.

The substrate 202 may include various circuit features formed thereon including, for example, features associated with field effect transistors (FETs), metal-oxide semiconductor field effect transistors (MOSFETs), CMOS transistors, high voltage transistors, high frequency transistors, bipolar junction transistors, diodes, resistors, capacitors, inductors, varactors, other suitable devices, and/or combinations thereof.

In some embodiments where the substrate 202 includes FETs, various doped regions, such as source/drain regions, are formed on the substrate 202. The doped regions may be doped with p-type dopants, such as phosphorus or arsenic, and/or n-type dopants, such as boron or $BF_2$, depending on design requirements. The doped regions may be planar or non-planar (e.g., in a fin-like FET device) and may be formed directly on the substrate, in a P-well structure, in an N-well structure, in a dual-well structure, or using a raised structure. Doped regions may be formed by implantation of dopant atoms, in-situ doped epitaxial growth, and/or other suitable techniques. In some embodiments, the substrate 202 includes fin elements extending from a top surface upon which gates for a multi-gate FET (e.g., fin-like FETs) are formed. In an embodiment, the patterned feature of a target layer 204 described below provides a gate structure disposed over a fin as illustrated by certain aspects of FIGS. 2-12, however, the present method 100 is not limited thereto. Further, in some embodiments, the method 100 may be used to form a masking element (e.g., FIG. 11) that is used to define regions of the substrate 202 for further processing such as, ion implantation, epitaxial growth, deposition, and/or other suitable processes.

In some embodiments, the substrate 202 is alternatively a photomask substrate that may include a low thermal expansion material (LTEM) such as quartz, silicon, silicon carbide, silicon oxide-titanium oxide compound, and/or other suitable materials. For example, the substrate 202 may be used to provide a photomask for deep ultraviolet (DUV) lithography, extreme ultraviolet (EUV) lithography, and/or other lithography processes. The patterning process of the method 100 of FIG. 1 may be used to form features on the photomask substrate for subsequent use in lithography processes for forming semiconductor features on a separate substrate.

Figure 2:
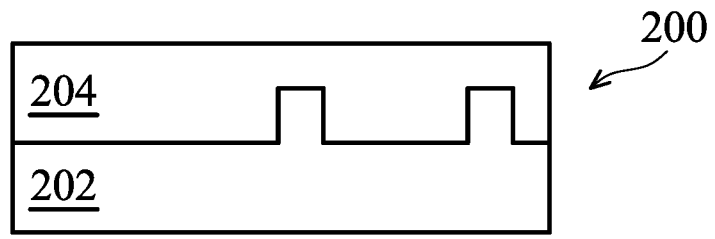
FIGS. 2-12 are fragmentary cross-sectional views of an exemplary device at intermediate steps of an exemplary method according to various aspects of the present disclosure.
Figure 3:
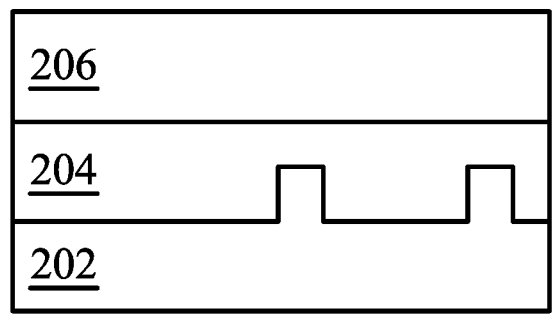
Figure 4:
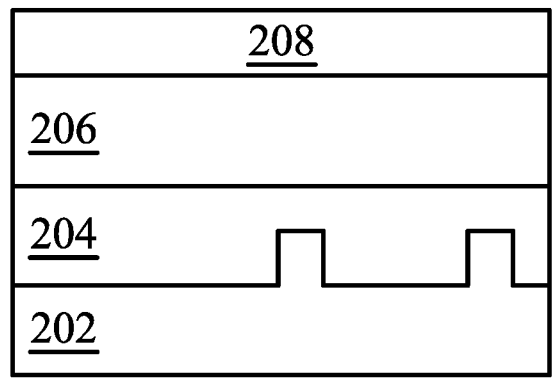

Continuing with reference to the example of FIG. 2, illustrated is a target layer 204 disposed over the provided substrate 202. It is noted that in some embodiments, the substrate 202 itself is the target for processing using the pattern produced by the steps of the method 100. That is, for example, the target layer 204 is omitted. The target layer 204 may have any composition suitable for processing in forming a device. In some embodiments, the target layer 204 is a hard mask layer including compositions such as, amorphous silicon (a-Si), silicon oxide, silicon nitride (SiN), titanium nitride, and/or other suitable compositions. In an embodiment, the target layer 204 may be an anti-reflective coating layer, a dielectric layer such as a high-k dielectric layer, a gate layer (e.g., polysilicon), a conductive layer, an interconnect layer such as interlayer dielectric (ILD) layers or conductive lines or vias, and/or various other layers and/or materials used in the fabrication of semiconductor devices to which a patterning is desired. The target layer 204 may be formed over the substrate 202 by one or more deposition processes such as physical vapor deposition (PVD), chemical vapor deposition (CVD), atomic layer deposition (ALD), spin-on coating, and/or other suitable deposition methods.

Referring to block 104 of FIG. 1, the method 100 continues to forming a bottom layer of a multi-layer photoresist over the substrate. Referring to the example of FIG. 3, a bottom layer 206 is formed over the substrate 202 and the target layer 204 (if present). In an embodiment, the bottom layer 206 has an organic material composition. For example, the bottom layer 206 may include a composition of carbon (C), hydrogen (H), and/or oxygen (O). In some embodiments, the bottom layer 206 is patternable (e.g., photosensitive). In some other embodiments, the bottom layer 206 is does not include a photosensitive material.

The bottom layer 206 may be formed by a suitable technique such as spin-on coating. The organic material composition of the bottom layer 206 may be included in a solvent for deposition (e.g., spin-coating). Any suitable solvent may be used including, for example, n-butyl acetate, methyl n-amyl ketone, 4-methyl-2-pentanol, propylene glycol methyl ether acetate, propylene glycol methyl ether, gamma-butyrolactone, ethyl lactate, cyclohexanone, ethyl ketone, dimethyl formamide, alcohol (e.g., ethanol and methanol), other suitable solvent, or combinations thereof. The solvent may be driven off by subsequent baking processes (e.g., pre-exposure bake).

The bottom layer 206 may function to be a planarizing layer of the multi-layer photoresist (also referred to simply as resist) stack. The bottom layer 206 may function to reduce the reflected light as an anti-reflective coating. Thus, in a further embodiment, the bottom layer 206 may have a high n value and/or a low k value. The composition of the bottom layer 206 may also be selected such that it provides sufficient etch selectivity to the target layer 204 and/or the substrate 202 as in some embodiments, the bottom layer 206 may be used as a mask during etching of the target layer 204/substrate 202.

One exemplary composition of the bottom layer 206 is a novolac resin such as provided by the chemical structure below where "n" denotes an integer greater than or equal to 2.

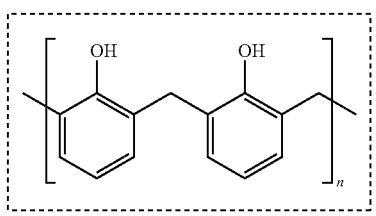

Other compositions including other polymer compositions are possible for the bottom layer 206. As discussed further below, the bottom layer 206 is an under layer or bottom layer of a multi-layer patterning scheme (multi-layer resist). As stated above, the composition of the bottom layer 206 may be selected such that the bottom layer 206 performs a bottom anti-reflective coating (BARC) function whose composition is chosen to minimize reflectivity of a radiation source implemented during exposure of a subsequently-formed photoresist layer. In some embodiments, the bottom layer 206 is deposited to a thickness of between approximately 300 and 1500 angstroms (A). The bottom layer 206 may be a conformal layer as deposited.

The method 100 of FIG. 1 then proceeds to block 106 where a "middle" layer of a multi-layer photoresist patterning scheme is deposited. Referring to the example of FIG. 4, a middle layer 208 is formed over the bottom layer 206. In some embodiments, the middle layer 208 directly interfaces the bottom layer 206. In other embodiments, other materials may interpose the middle layer 208 and underlying bottom layer 206.

The middle layer 208 may include a composition including silicon (Si), hydrogen (H), and/or oxygen (O). The middle layer 208 may be a silicon containing hard mask layer. In some embodiments, the middle layer 208 is a spin-on glass (SOG) film or silicate. For example, the middle layer may be SiO2. In other embodiments, the middle layer may include a nitride such as silicon nitride or silicon oxynitride.

In some embodiments the middle layer 208 is formed by spin-on deposition. However, other suitable deposition methods are also possible. Exemplary thicknesses of the middle layer 208 include, but are not limited to, approximately 30 to 300 angstroms.

As stated above, the bottom layer 206 and the middle layer 208 may provide two layers of a multi-layer resist stack. In some implementations of a tri-layer resist formulation, a photosensitive layer is disposed directly on top of the middle layer of the tri-layer resist. However, the intrinsic difference in structure between the overlying photoresist composition and the middle layer of the tri-layer resist formulation can provide a point of weakness. This weakness if not mitigated can lead to the overlying photoresist features undesirably "peeling off" from the middle layer.

Thus, the method 100 of FIG. 1 advantageously proceeds to block 108 where an adhesion layer (also referred to as a coating) is formed over the middle layer. In some embodiments, the adhesion layer is disposed directly on the middle layer. The adhesion layer maybe a conformal coating. Further, the adhesion layer may have a direct interface with the overlying photoresist layer as described below. Referring to the example of FIG. 5, an adhesion layer 210 is disposed over the middle layer 208.

The adhesion layer 210 includes a polymer composition including an epoxy group (also referred to as an epoxide functional group) attached to the polymer. An epoxy group is a cyclic ether with a three atom ring, which is highly reactive due to the strain of the ring. A chemical schematic representation of the epoxy group is provided below where R1 or R2 provides the bonding to the polymer backbone and the other of R1 or R2 is H or any other suitable component.

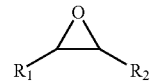

In an embodiment, the adhesion layer 210 includes silicon based polymer having the epoxy functional group bonded thereto. For example, in some embodiments, the adhesion layer may include a siloxane polymer with an epoxy group bonded thereto. For example, the following structure may be provided showing the siloxane polymer backbone (with n and m greater than 0), and the epoxy group attached thereto:

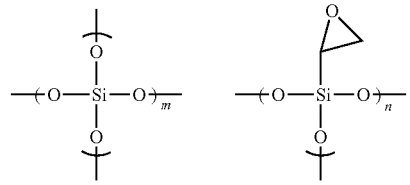

In some examples, m is equal to between approximately 40 and 90. In some examples, n is equal to between approximately 10 and 60.

In some embodiments, the adhesion layer 210 is deposited by a spin-coating process. The spin-coating process may be implemented by depositing a polymer (having the epoxy functional group) dissolved in a suitable solvent over the substrate 202. The spin-coating may include rotating the substrate 202 to cause the polymer (having the epoxy functional group) to form a thin coating providing the adhesion layer 210 across a top surface of or above the substrate 202. Any suitable solvent may be used including, for example, n-butyl acetate, methyl n-amyl ketone, 4-methyl-2-pentanol, propylene glycol methyl ether acetate, propylene glycol methyl ether, gamma-butyrolactone, ethyl lactate, cyclohexanone, ethyl ketone, dimethyl formamide, alcohol (e.g., ethanol and methanol), other suitable solvent, or combinations thereof. It is noted that subsequently, the solvent is evaporated by baking (i.e., curing) to form the adhesion layer 210.

In some embodiments, a thickness of the adhesion layer 210 is between approximately 50 Angstroms and approximately 100 Angstroms. It is noted that the thickness may affect subsequent etching processes (e.g., patterning of the middle layer 208) and as such should be controlled as discussed below.

Figure 7:
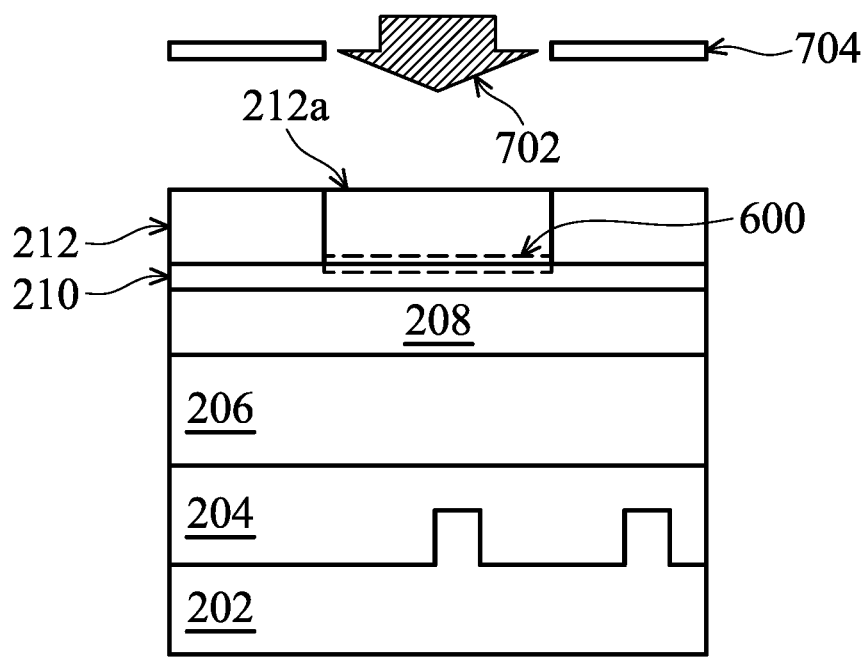

The method 100 then proceeds to block 110 where a photoresist layer is formed on the adhesion layer. Using the example of FIG. 6, a photoresist layer 212 is formed over the adhesion layer 210. It is noted that the stack of the bottom layer 206, the middle layer 208, and the photoresist layer 212 and including the interposing adhesion layer 210 form a multi-layer resist stack 214 to be used for a patterning scheme for the substrate 202 and/or target layer 204. The photoresist layer 212 may be any lithographically sensitive resist material, and in many embodiments, the photoresist layer 212 includes a photoresist material sensitive to a radiation source (e.g., UV light, deep ultraviolet (DUV)

radiation, and/or EUV radiation as depicted in FIG. 7). However, the principles of the present disclosure may also apply to e-beam resists and other direct-write resist materials. In one embodiment, the photoresist layer 212 includes a resist material that polymerizes (and/or crosslinks) and subsequently becomes more insoluble in a developer after the resist material is exposed to a radiation source. The photoresist layer 212 may be a negative tone development (NTD) resist, i.e., its solubility in a developer decreases upon the radiation. An example of the resist used in an NTD process is a polymeric material including cross-linkable polymer and cross-linkers, where the polymer molecules of the resist itself cross-link upon radiation. It is noted that this cross-linking within the photoresist layer 212 itself (i.e., by the polymer provided as photoresist layer 212) is separate and distinct from the cross-linking with the epoxy group of the adhesion layer 210 that is discussed below.

The photoresist layer 212 includes a polymer having photosensitive functional groups such as, for example, a photo-acid generator (PAG), a thermal-acid generator (TAG), a photo-base generator (PBG), a photo-decomposable base (PDB), a photo-decomposable quencher (PDQ), or other photosensitive functional groups. Exemplary photoresist compositions include resists sensitive to a radiation, such as an I-line light, a DUV light (e.g., 248 nm radiation by krypton fluoride (KrF) excimer laser or 193 nm radiation by argon fluoride (ArF) excimer laser), a EUV light (e.g., 13.5 nm light), an e-beam, an x-ray, and an ion beam. For example, an exemplary KrF sensitive resist composition and ArF sensitive resist composition are provided below where x and y and a, b and c are any integer greater than 1.

tion 702. In some embodiments, the radiation 702 is provided from a source that provides an I-line (wavelength approximately 365 nm), a DUV radiation such as KrF excimer laser (wavelength approximately 248 nm) or ArF excimer laser (wavelength approximately 193 nm), a EUV radiation (wavelength from about 1 nm to about 100 nm), an x-ray, an e-beam, an ion beam, and/or other suitable radiations. The exposure process providing the radiation 702 may be performed in air, in a liquid (immersion lithography), or in vacuum (e.g., for EUV lithography and e-beam lithography). In the depicted embodiment, the exposure process at block 112 and the example of FIG. 7 implements a photolithography technique using a photomask 704 that includes a pattern providing the opening for radiation 702 to become incident the device 200. The photomask 704 may be a transmissive mask or a reflective mask, the latter of which may further implement resolution enhancement techniques such as phase-shifting, off-axis illumination (OAI) and/or optical proximity correction (OPC). In alternative embodiments, the radiation 702 is patterned directly without using a photomask 704 (such as using a digital pattern generator or direct-write mode). In an embodiment, the radiation 702 is a EUV radiation and the exposure process at block 112 is performed in a EUV lithography system. Correspondingly, a reflective photomask 704 may be used to pattern the photoresist layer 212.

As depicted in FIG. 7, regions 212a of the photoresist layer 212 are exposed to the radiation 702; these exposed regions 212a undergo chemical changes while unexposed regions remain substantially unchanged in chemical properties. Accordingly, following the exposure process at block

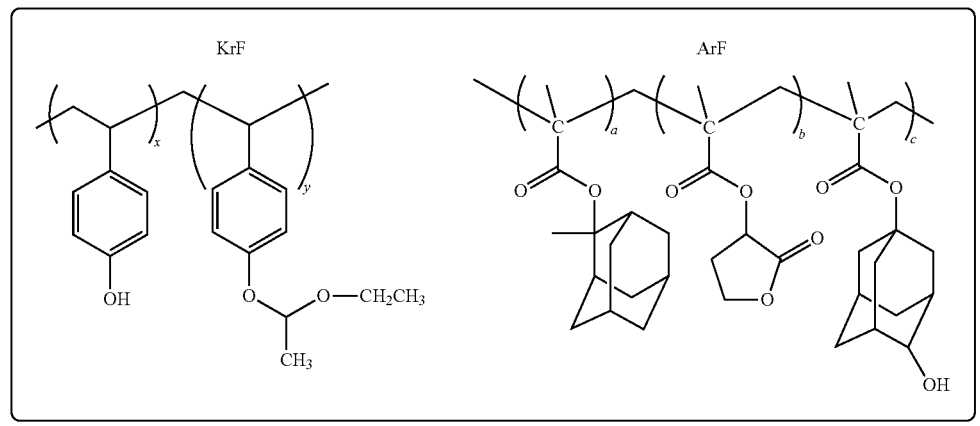

The photoresist layer 212 may also include a solvent(s) on deposition that are subsequently driven off as part of the spin coating, during a settling process, and/or during a post-application/pre-exposure baking process. The pre-exposure baking process may be implemented by any suitable equipment such as, for example, a hotplate, at any temperature suitable for the particular compositions of the photoresist layer 212 and the solvent(s) employed.

The method 100 then proceeds to block 112 where an exposure process is performed. The exposure process may be performed by a system employing deep ultraviolet (DUV) lithography, extreme ultraviolet (EUV) lithography, electron beam (e-beam) lithography, x-ray lithography, ion beam lithography, and other lithography processes. Referring to block 112 of FIG. 1 and to the example of FIG. 7, the method 100 exposes the photoresist layer 212 to the radia- 112, in the embodiment of a NTD resist, the exposed regions 212a of the photoresist layer 212 undergo polymerization and/or crosslinking of the resist material and may become less soluble to a subsequently applied developer as a result. The exposure to the radiation 702 may also in some embodiments provide for some cleaving of an acid leaving group in the exposed region 212a as discussed below.

The method 100 then proceeds to block 114 where a post exposure bake (PEB) is performed. The PEB may include baking the device 200 after block 112 is completed. In an embodiment, the PEB is performed between approximately 150 and approximately 350 degrees Celsius. The post-exposure baking process may catalyze any chemical reaction initiated by the exposure process at block 112 within the photoresist layer 212, and also between the exposed photoresist layer 212 and adhesion layer 210 as discussed below.

For example, the post-exposure baking process may accelerate a cleaving of the acid labile group, accelerate the crosslinking within the photoresist layer 212, and/or accelerate the crosslinking between the photoresist layer 212 and the adhesion layer 210.

Referring still to the method 100 of FIG. 1, provided in block 116 of the method 100 is a cross-linking between the adhesion layer and the overlying photoresist layer occurs. The cross-linking forms a cross-linked region between the adhesion layer and upper portions of the exposed photoresist layer. Block 116 may occur after and/or concurrently with block 112 of the method 100. Additionally or alternatively, block 116 may occur concurrently with block 114 of the method 100 and/or result from the process of block 114. In other words, the cross-linking between the adhesion layer and the photoresist layer may develop at the time of exposure and/or be facilitated by the PEB.

As an example of the cross-linking between the exposed photoresist and the adhesion layer, in an embodiment, the photoresist layer 212 includes a polymer having an acid labile group. In some embodiments, the acid labile group molar ratio in the polymer is between approximately 20% and approximately 70%. The percentage of acid labile group molar ratio can affect the extent of the cross-linking as it affects the —COOH functional groups produced which in turn affect the extent of cross-linking as discussed below. During and/or after exposure of the photoresist layer 212, the composition of the exposed portions of the photoresist 212a undergo a cleaving of the acid labile group generating —COOH (carboxylic acid) functional groups. The —COOH functional group now attached to the polymer of the exposed portion 212a of the photoresist can cross-link with the available epoxy group of the adhesion layer 210. Adjusting the loading of —COOH functional group that will be produced on the polymer backbone of the exposed region 212a may tune the cross-linkability of the photoresist layer 212 to the adhesion layer 210. That is, in some embodiments, adjusting the acid labile group molar ratio affects the extent of cross-linking.

In an embodiment, a crosslinking region 600 is created by the bonding (cross-linking) of the adhesion layer (epoxy group) and the photoresist layer 212 (the —COOH group). The crosslinking region 600 may be disposed on the adhesion layer 210. In some embodiments, the crosslinking region 600 extends approximately 15 angstroms into the photoresist layer 212. Further discussion of block 116 and the resulting crosslinking region, such as illustrated by crosslinking region 600, is provided with reference to FIGS. 13-15 discussed below.

Figure 8:
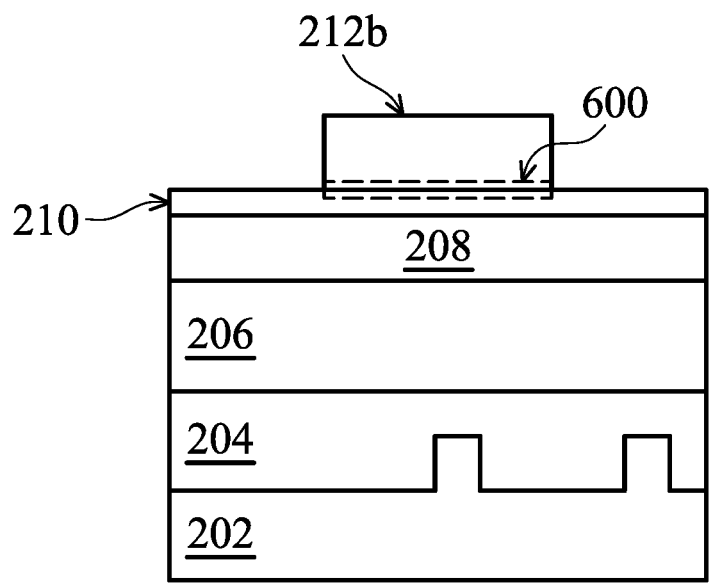
Figure 9:
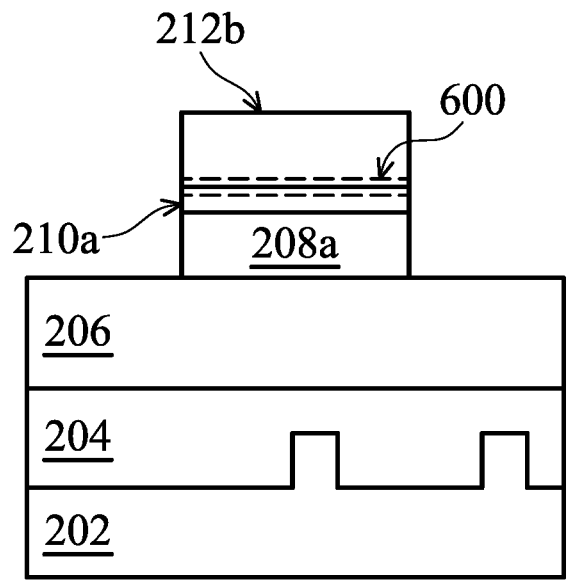
Figure 10:
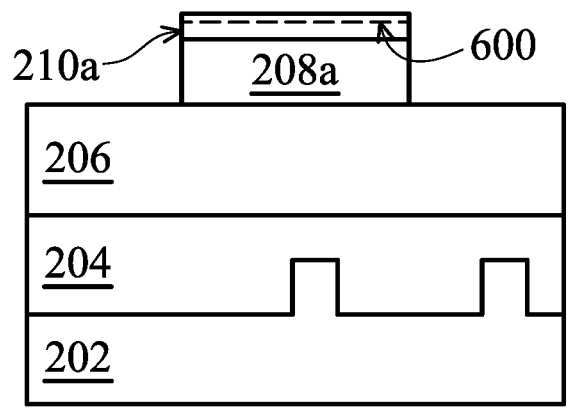

Continuing with the method 100 of FIG. 1, the method 100 proceeds to block 118 where the now-exposed photoresist layer is developed. Referring to the example of FIGS. 7 and 8, the photoresist layer 212 including exposed photoresist region 212a is introduced to a developer to form a resist pattern illustrated as resist pattern feature 212b in FIG. 8. In an embodiment, a negative tone developer (NTD) is applied. In an embodiment, the developer applied includes an organic solvent having a Log P value greater than 1.82. See U.S. Pat. No. 9,459,536 which describes a suitable developer and is hereby incorporated by reference in its entirety. The developer may include an aqueous solvent or an organic solvent. Suitable organic-based developers include n-butyl acetate, ethanol, hexane, benzene, toluene, and/or other suitable solvents, and suitable aqueous developers include aqueous solvents such as tetramethyl ammonium hydroxide (TMAH), KOH, NaOH, and/or other suitable solvents. In cases wherein a NTD resists and developers are used, as illustrated in FIGS. 7 and 8, the exposed portion 212a of the photoresist layer 212 are maintained while the unexposed portions are removed thereby forming one or more openings in the photoresist layer 212. It is noted that the crosslinking region 600 remains within the resist pattern 212b.

The method 100 then proceeds to block 120 where etching process(es) are performed while using masking elements resist pattern provided by the developed photoresist discussed above, and/or patterns provided in the underlying layers using the developed photoresist. Using FIG. 9 as exemplary, the middle layer 208 is etched using the patterned resist feature 212b feature. In some embodiments, the same etching process used to pattern the middle layer 208 also (substantially concurrently) patterns the adhesion layer 210 thereby providing patterned middle layer 208a and patterned adhesion layer 210a in a single etching process using the patterned resist 212b as masking element during the single etching process. It is noted that the composition and thickness of the adhesion layer 210 are to be considered in the formation of the patterned adhesion layer 210a. If the adhesion layer 210 includes a carbon based material, the patterned adhesion layer 210a may need to be relatively thinner in order to not impact the ability to use a single etching step for the adhesion layer 210 and the middle layer 208. If the adhesion layer 210 is a silicon based layer as well as the middle layer 208 being a silicon based layer the single etching step may be more quickly facilitated should the compositions provide similar etching rates. In some embodiments, the thickness of the adhesion layer 210 is between approximately 50 Angstroms and 100 Angstroms. In an embodiment, the adhesion layer has an epoxy group, which provides for a higher carbon percentage and a lower etch rate (relative to the middle layer) during the middle layer etching by suitable etchant (e.g., CF4 gas). A thinner adhesion layer therefore may be desirable. In contrast to this desire for a thin adhesion layer, there may be concerns of fabricating the layer (e.g., bubbles) if the thickness is too low (e.g., below 50 Angstroms).

Block 120 may continue to process underlying layers. For example, in some embodiments, subsequent to forming the patterned middle layer 208a, the patterned middle layer 208a is used as masking element during the subsequent etching process(es) directed at the bottom layer 206. During the etching of the bottom layer 206, the masking element may include the patterned middle layer 208a and the patterned adhesion layer 210a disposed thereon. This etching step of the bottom layer 206 may be separate from (e.g., using different etchants) than the etching step used to provide the patterned middle layer 208a. The resist pattern 212b may be partially consumed or fully consumed during the etching of the bottom layer 206. Se FIG. 10. The method 100 may have an optional operation to strip off the remaining portions of the resist pattern 212b after forming the patterned middle layer 208a. For example, the resist pattern 212b is subsequently removed using any suitable method such as, for example, by plasma ashing or flushing using oxygen and/or nitrogen plasma.

Figure 11:
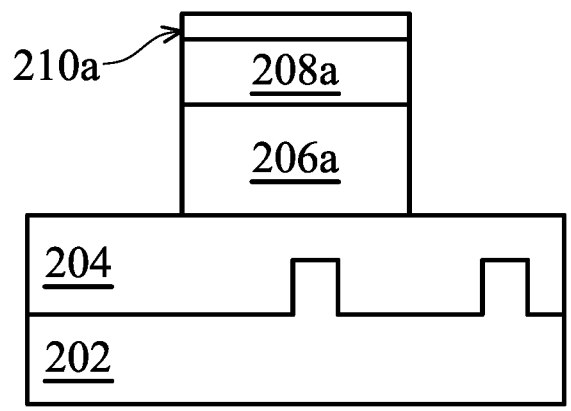

The etching thus provides a patterned bottom layer 206a having the patterned middle layer 208a disposed thereon. In some embodiments, the patterned adhesion layer 210a is also disposed over the patterned bottom layer 206a and patterned middle layer 208a as illustrated in FIG. 11. The crosslinking region 600 may also continue to be disposed on the masking element including the patterned middle layer 208a. In other embodiments, the crosslinking region 600 may be removed simultaneously with the photoresist pattern feature 212b.

Figure 12:
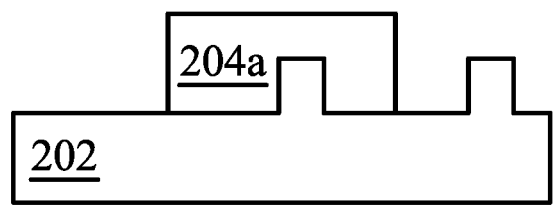

The method 100 then proceeds to block 122 where continued fabrication is performed. The continued fabrication may use the masking element including the patterned middle layer, patterned bottom layer, and/or patterned adhesion layer. As illustrated in FIGS. 11 and 12, the patterned bottom layer 206a, the patterned middle layer 208a, and/or the patterned adhesion layer 210a are used as a masking element during the etching of the target layer 204 creating patterned target layer 204a. In some embodiments, the patterned middle layer 208a and patterned adhesion layer 210a are removed and the patterned bottom layer 206a is used as a masking element. In other embodiments, in addition to or in lieu of an etching process, any suitable method may be performed to process the substrate 202 using the patterned bottom layer 206a, the patterned middle layer 208a, and/or the patterned adhesion layer 210a as a masking element including additional etching process, a deposition process, an implantation process, an epitaxial growth process, and/or any other fabrication process.

The etching of block 120 and/or block 122 may be accomplished using any suitable method including a dry etching process, a wet etching process, other suitable etching process, a reactive ion etching (RIE) process, or combinations thereof. In an exemplary embodiment, a dry etching process is implemented and employs an etchant gas that includes an oxygen-containing gas (e.g., $O_2$), a carbon-containing gas (e.g., $C_xH_y$, where x and y may be any integers), a fluorine-containing etchant gas (e.g., $C_xF_y$, $C_xH_yF_z$, $N_xF_y$, and/or $S_xF_y$, where x, y, and z may be any integers), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

In some embodiments, the bottom layer 206 is a photosensitive layer. Therefore, the method 100 (FIG. 1) may include performing additional exposing process(es) to the bottom layer 206 through openings of the masking element including patterned middle layer 208a. By using two resist layers and double exposing process, the fidelity of the process window may be improve and a smaller critical dimension may be achieved.

Although not shown in FIG. 1, the method 100 may proceed to further processes in order to form a final pattern or device. For example, the method 100 may etch the substrate 202 with the target layer 204 as an etch mask. For another example, the method 100 may deposit additional layer(s) above the target layer 204 and perform patterning processes to the additional layer(s). For example, the method 100 may form shallow trench isolation (STI) features for defining transistor active regions, may form fin-like protrusions in the respective substrates for forming FinFETs, may form contact holes for transistor source/drain/gate contacts, and may form interconnect features.

The device 200 may then be provided for additional fabrication processes. For example, the device 200 may be used to fabricate an integrated circuit chip, a system-on-a-chip (SOC), and/or a portion thereof, and thus the subsequent fabrication processes may form various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, other types of transistors, and/or other circuit elements.

Figure 5:
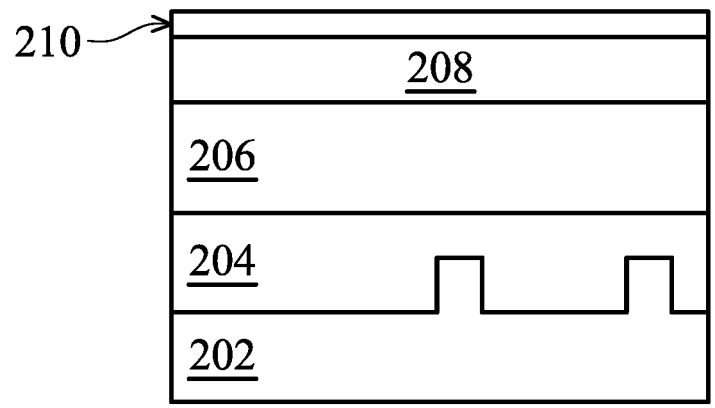
Figure 13:
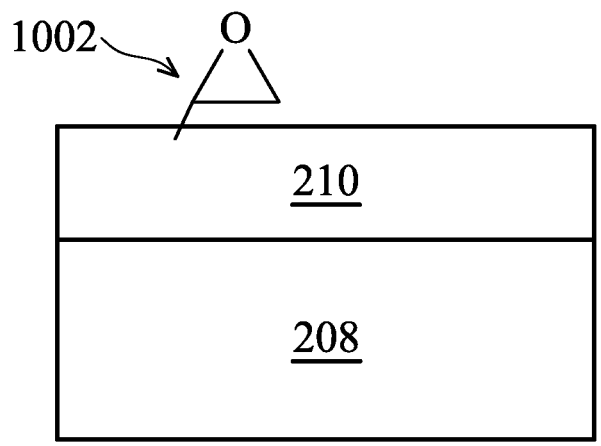
FIGS. 13, 14, and 15 are also fragmentary cross-sectional views of an exemplary device at intermediate steps of an exemplary method and illustrate in further detail an interface provided in the exemplary method.
Figure 14:
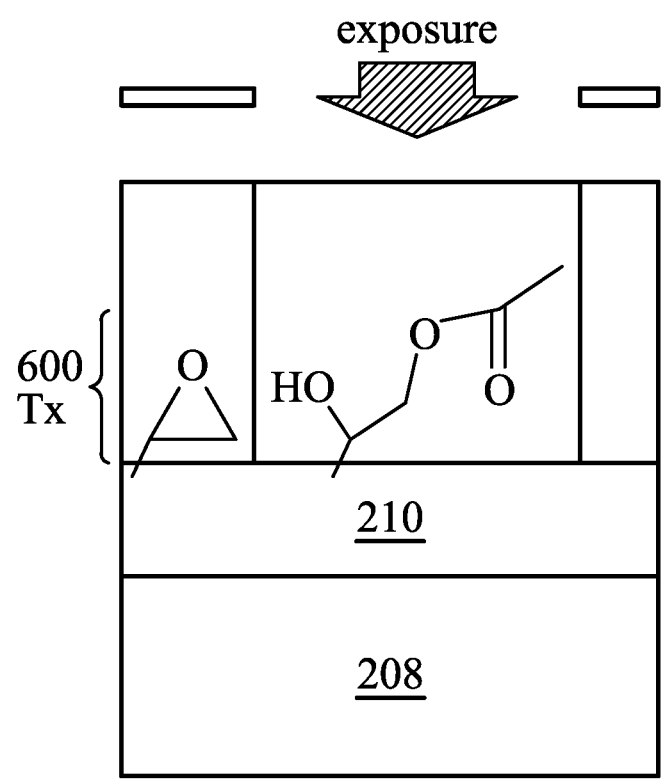
Figure 15:
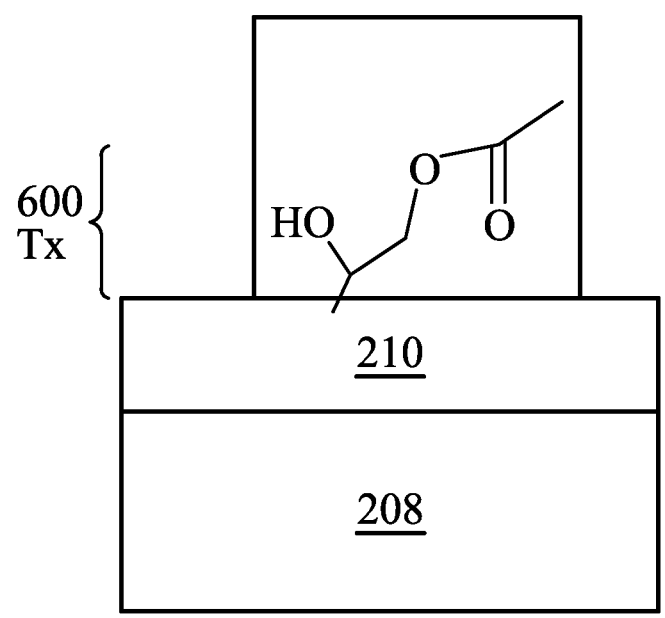

Referring again to blocks 108, 110, 112, 114, and 116 of the method 100 of FIG. 1, further description is provided with reference to FIGS. 13, 14, and 15 detailing exemplary crosslinking provided between the adhesion layer and the overlying photoresist layer. FIG. 13 is substantially similar to a portion of FIG. 5 illustrating the adhesion layer 210 formed over the middle layer 208, each described in detail above. FIG. 13 illustrates that a top surface of the adhesion layer 210 includes available epoxy ring 1002 available for bonding. As explained above, the epoxy ring 1002 may be a functional group attached to a polymer of the adhesion layer 210. The epoxy ring 1002 is highly reactive due to the stress of the three element ring. Example backbone of the polymer is illustrated below and the epoxy ring 1002 attached.

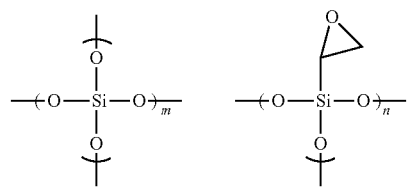

In some embodiments, m is between approximately 40 and 90 and n is between approximately 10 and 60. In some embodiments, m is greater than n.

Figure 6:
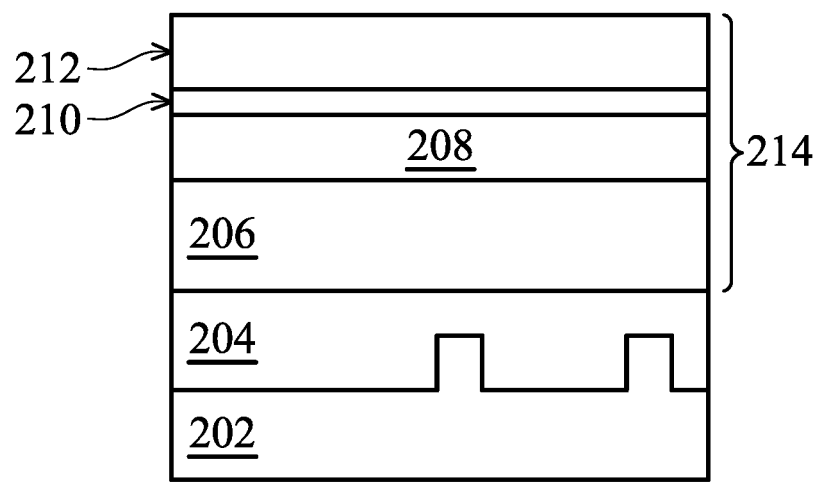

FIG. 14 is illustrative of subsequent processing of the device including blocks 112, 114, and 116 where a photoresist layer 212 is disposed over the adhesion layer 210, an exposure process is performed introducing radiation 702 that creates exposed photoresist region 212a, each of which is described above with reference to the method 100 and exemplary FIGS. 6-7. Illustrated by FIG. 14 is the exemplary cross-linking between the exposed resist portion 212a and the underlying adhesion layer 210. Namely, the epoxy ring of the adhesion layer 210 is opened and a photoresist component is cross-linked to the opened epoxy ring. In some embodiments, the exposed photoresist region 212a undergoes a cleaving of an acid labile group attached to the polymer. The cleaving of the acid labile group generates —COOH (carboxylic acid) functional groups. This —COOH functional group can cross-link with the available epoxy group of the adhesion layer 210. The baking process of block 114 may further advance this cross-linking. The thickness Tx of the cross-linked region 600 can be approximately 15 Angstroms. In some embodiments, the thickness Tx of the cross-linked region 600 can be between approximately 5 Angstroms and approximately 25 Angstroms. It is noted that no cross-linking may occur in the portions of the photoresist layer 212 not subject to the exposure by radiation 702. FIG. 15 is illustrative of the photoresist layer 212 after development and removal of the non-exposed portions of the photoresist layer 212. The cross-linked region 600 remains.

Although not intended to be limiting, one or more embodiments of the present disclosure provide many benefits to a semiconductor device and a formation process thereof. For example, embodiments of a multi-layer photoresist structure including an adhesion layer offers greater control over the lithographic patterning process by mitigating a risk of photoresist peeling. As a result, opportunities forming photoresist features with sufficient aspect ratio may be afforded by embodiments provided herein.

In an embodiment, a method is provided that includes forming a first layer over a substrate. An adhesion layer is formed over the first layer. The adhesion layer has a composition including an epoxy group. A photoresist layer is formed directly on the adhesion layer. A portion of the photoresist layer is exposed to a radiation source. The composition of the adhesion layer and the exposed portion of the photoresist layer are cross-linked. The epoxy group provides the cross-linking. The photoresist layer is developed to form a photoresist pattern feature.

In a further embodiment, the adhesion layer is formed by spin-coating the composition. In an embodiment, the composition of the adhesion layer is a silicon based polymer with the epoxy group. In a further embodiment, composition of the adhesion layer is a siloxane polymer with the epoxy group. In an embodiment, the cross-linking creates a cross-linked region of the photoresist layer. The cross-linked region is between a portion of the exposed photoresist and the adhesion layer. In an embodiment, the radiation source is an extreme ultra-violet (EUV) wavelength radiation source. In an embodiment, developing the photoresist layer includes providing a negative-tone developer. In an embodiment, forming the first layer over the substrate includes depositing a second composition including silicon, oxygen and hydrogen.

In another of the broader examples, a method includes forming a first layer over a substrate. An adhesion layer is formed over the first layer. The adhesion layer includes a polymer having an epoxy functional group. A photoresist layer is formed directly on the adhesion layer. The method includes using an extreme ultraviolet (EUV) radiation source to expose the photoresist layer, the exposed photoresist layer is baked. During at least one of the exposing or the baking, the epoxy functional group of the adhesion layer is cross-linked to the exposed photoresist layer creating a cross-linked region between a portion of the exposed photoresist layer and the adhesion layer. The method continues to apply a negative tone developer (NTD) to develop the photoresist layer to form a photoresist pattern feature, wherein the cross-linked region underlies the photoresist pattern feature. A first etching process is performed while using the photoresist pattern feature as an etch mask to form a patterned first layer, wherein the first etching process removes portions of the adhesion layer disposed over the first layer.

In a further embodiment, the method includes performing a second etching process using the patterned first layer to etch an underlying layer. In an embodiment, the underlying layer is an anti-reflective coating layer. In an embodiment, the adhesion layer includes a siloxane polymer with the epoxy functional group attached. In an embodiment, the adhesion layer is a spin coated conformal layer. In an embodiment, the epoxy functional group of the adhesion layer is cross-linked to the exposed photoresist layer by an opening of the epoxy functional group. In an embodiment, the epoxy functional group bonds with a —COOH functional group of the exposed photoresist layer. The —COOH functional group may be generated by cleaving of an acid labile group during the exposing.

In yet another of the broader embodiments described is a method including forming a hard mask layer over a substrate and spin-coating an adhesion layer over and directly interfacing the hard mask layer. A photoresist layer is then formed over and directly interfacing the adhesion layer. A first region of the photoresist layer is exposed. The method includes forming a cross-linked region between the adhesion layer and the first region of the photoresist layer. A negative tone developer is used to develop the photoresist layer to form a photoresist pattern feature over the cross-linked region.

In a further embodiment, the adhesion layer includes a polymer having an epoxy functional group. In an embodiment, the hard mask layer includes silicon, oxygen, and hydrogen. In an embodiment, the forming the photoresist layer includes forming a polymer providing at least one of a KrF sensitive resist composition or ArF sensitive resist composition.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first layer over a substrate, wherein the first layer is a first composition of silicon (Si) and oxygen (O);
    after forming the first layer, forming an adhesion layer over a top surface of the first layer, wherein the adhesion layer has a composition including silicon based polymer with an epoxy group;
    forming a photoresist layer directly on the adhesion layer;
    exposing a portion of the photoresist layer to a radiation source;
    upon initiating the exposing, cross-linking the composition of the adhesion layer and the exposed portion of the photoresist layer, wherein the epoxy group provides the cross-linking; and
    developing the photoresist layer to form a photoresist pattern feature.

2. The method of claim 1, wherein the forming the adhesion layer includes spin-coating the composition.

3. The method of claim 1, wherein the silicon based polymer is a siloxane polymer.

4. The method of claim 1, wherein the cross-linking creates a cross-linked region of the photoresist layer, wherein the cross-linked region is between a remaining portion of the exposed photoresist and the adhesion layer.

5. The method of claim 1, wherein the radiation source is an extreme ultra-violet (EUV) wavelength radiation source.

6. The method of claim 1, wherein the developing the photoresist layer includes providing a negative-tone developer.

7. The method of claim 1, wherein the forming the first composition is silicon oxide.

8. The method of claim 1, wherein the forming the adhesion layer over the top surface of the first layer includes spin on coating the adhesion layer on the top surface of the first composition, wherein the first composition is silicon oxide.

9. A method, comprising:
    forming a first layer over a substrate, wherein the first layer includes silicon and at least one oxygen and hydrogen;

depositing by spin on coating an adhesion layer over a top surface of the first layer, wherein the adhesion layer includes a polymer having an epoxy functional group and a solvent;

forming a photoresist layer directly on the adhesion layer;

using an extreme ultraviolet (EUV) radiation source, exposing a first region of the photoresist layer while masking a second region of the photoresist layer;

baking the exposed photoresist layer;

wherein during at least one of the exposing or the baking, the epoxy functional group of the adhesion layer is cross-linked to the first region of the photoresist layer creating a cross-linked region between a portion of the exposed photoresist layer and the adhesion layer wherein the epoxy functional group of the adhesion layer does not cross-link to the second region of the photoresist layer;

applying a negative tone developer (NTD) to develop the photoresist layer to form a photoresist pattern feature of the first region of the photoresist layer, wherein the cross-linked region underlies the photoresist pattern feature; and performing a first etching process while using the photoresist pattern feature as an etch mask to form a patterned first layer, wherein the first etching process removes portions of the adhesion layer disposed over the first layer.

10. The method of claim 9, further comprising:

performing a second etching process using the patterned first layer to etch an underlying layer.

11. The method of claim 10, wherein the underlying layer is an anti-reflective coating layer.

12. The method of claim 9, wherein the adhesion layer includes a siloxane polymer with the epoxy functional group attached.

13. The method of claim 9, wherein the epoxy functional group of the adhesion layer is cross-linked to the exposed photoresist layer by an opening of the epoxy functional group under the first region of the photoresist layer, wherein the epoxy functional group does not open under the second region of the photoresist layer.

14. The method of claim 9, wherein the epoxy functional group bonds with a —COOH functional group of the exposed first region of the photoresist layer.

15. The method of claim 14, wherein the —COOH functional group is generated by cleaving of an acid labile group during the exposing.

16. The method of claim 9, wherein the adhesion layer is cross-linked to the first region of the photoresist layer by bonding an epoxy group and a —COOH functional group, creating a cross-linked region between a portion of the exposed photoresist layer and the adhesion layer.

17. A method, comprising:

forming a hard mask layer over a substrate;

spin-coating an adhesion layer over and directly interfacing the hard mask layer wherein the adhesion layer includes epoxy functional groups;

forming a photoresist layer over and directly interfacing the adhesion layer;

exposing a first region of the photoresist layer, wherein the exposing the first region of the photoresist layer generates —COOH functional groups;

forming a cross-linked region between the adhesion layer and the first region of the photoresist layer by bonding the —COOH functional groups and the epoxy functional groups; and using a negative tone developer, developing the photoresist layer to form a photoresist pattern feature over the cross-linked region.

18. The method of claim 17, wherein the adhesion layer includes a silicon based polymer having the epoxy functional groups.

19. The method of claim 17, wherein the hard mask layer includes silicon, oxygen, and hydrogen.

20. The method of claim 17, wherein the forming the photoresist layer includes forming a polymer providing at least one of a KrF sensitive resist composition or ArF sensitive resist composition.

* * * * *